United States Patent [19]
Miyake

[11] Patent Number: 5,394,147
[45] Date of Patent: Feb. 28, 1995

[54] SEQUENTIAL CONVERSION-TYPE ADC USING PREDETERMINED BITS

[75] Inventor: Takashi Miyake, Hyogo, Japan

[73] Assignee: Mitsubishi Denki Kabushiki Kaisha, Tokyo, Japan

[21] Appl. No.: 33,215

[22] Filed: Mar. 18, 1993

[30] Foreign Application Priority Data

Jun. 10, 1992 [JP] Japan .................. 4-176071

[51] Int. Cl.⁶ .................................. H03M 1/42
[52] U.S. Cl. ............................ 341/161; 341/163
[58] Field of Search ................. 341/161, 162, 163

[56] References Cited

U.S. PATENT DOCUMENTS

| | | | |
|---|---|---|---|
| 4,490,713 | 12/1984 | Mrozowski et al. | 341/163 |
| 4,764,750 | 8/1988 | Kawada | 341/161 |
| 5,229,770 | 7/1993 | Nakajima | 341/161 |
| 5,252,976 | 10/1993 | Miho et al. | 341/163 |

*Primary Examiner*—Marc S. Hoff
*Attorney, Agent, or Firm*—Townsend and Townsend Khourie and Crew

[57] ABSTRACT

A sequential conversion-type A/D converter having a fixing bit register for identifying which bits of a sequential conversion register are to be fixed, a fixed value register for holding the binary values of the bits of the sequential conversion register to be fixed, and a conversion start position setting circuit for identifying a leading bit of the sequential conversion register as a bit of a lower order than the bits of said sequential conversion register to be fixed. The control circuit starts sequential conversion from the bit set by the conversion start position setting circuit. The invention achieves a sequential conversion type A/D converter which can convert, in a shorter period of time than the prior art, analog input signals showing small changes, without deteriorating conversion accuracy.

8 Claims, 12 Drawing Sheets

SEQUENTIAL CONVERSION-TYPE ADC USING PREDETERMINED BITS

BACKGROUND OF THE INVENTION

The present invention relates to sequential conversion-type A/D converters. In particular, this invention relates to sequential conversion-type ADCs with a control circuit for converting an analog input signal to a digital value, the control circuit proceeding sequentially from a leading bit through lower order bits of a sequential conversion register.

FIG. 10 and FIG. 11 are diagrams of the configuration and key parts, respectively, of a conventional sequential A/D converter.

FIG. 10 shows comparator 1 for comparing an analog input signal with the value of a D/A conversion result; sequential conversion register 2 for storing the result of A/D conversion and for decoding input data for a D/A converter; D/A converter 3 for converting the digital value (conversion result) of sequential conversion register 2 into an analog value; control circuit 4 for sequential conversion; and clock generator circuit 5 for A/D conversion. Analog input signal A, bit setting signals B supplied from control circuit 4 to sequential conversion register 2, one-bit conversion signal C, A/D conversion start signal D supplied from clock generator circuit 5 to both control circuit 4 and comparator 1, comparison voltage E output from D/A converter 3, and conversion complete signal F are also shown.

In FIG. 11 are shown latch circuit 6a for taking in data during a time interval "H" of an input clock signal (CLK) and latching data on the falling edge of the clock signal. Latch circuit 6a is set and reset by set signal S and reset signal R, respectively. Also shown is latch circuit 6b for taking in data during a time interval "L" of the input clock signal and latching data on the rising edge of the clock signal. Latch circuits 6a and 6b constitute a shifter S. Bits 70 to 77 and 7S of shifters S (which form the control circuit 4) are arranged in order from high to low. Bit setting signals B7 to B0 are supplied to bits a7 to a0, respectively, of sequential conversion register 2 and correspond to bit setting signals B of FIG. 10. In other words, control circuit 4 is constructed of shifters S, each consisting of latch circuits 6a and 6b connected to each other in a cascade manner and forming each of bits 77 to 70 and 7S.

Next, the operation of the A/D converter will be described. A/D conversion start signal D becomes active at the start of A/D conversion, and shifter S of bit 77 of control circuit 4 is set. Thereby, bit setting signal B7 becomes active in synchrony with a change in a one-bit conversion signal so that the leading bit a7 is set to "1" and bits a6 to a0 of sequential conversion register 2 are set to "0." At this time, a digital value of sequential conversion register 2 is decoded into an analog value (comparison voltage E) by D/A converter 3. Comparison voltage E and analog input voltage A, input from outside, are compared by comparator 1 in response to one-bit conversion signal C. Only when comparison voltage E from D/A converter 3 is higher than analog input signal A does the comparison result clear the value of bit a7 which has been set to "1" and resets it to "0". In this way, the conversion of bit a7 is first performed. Thereafter, for the conversion of bit a6, one-bit conversion signal C becomes active again, whereby the "1" of bit 77 is shifted to bit 76, and "0" is latched into bit 77. This activates only bit setting signal B6, and bit a6 is set to "1." Comparison between analog input voltage A and comparison voltage E from D/A converter 3 (decoded with a7 set to "1" or "0", a6 to "1", and a5 to a0 to "0") is performed by comparator 1 in response to one-bit conversion signal C. Like the conversion of bit a7, only when comparison voltage E is higher than analog input voltage A is bit a6 cleared.

In this manner, the "1" of bit 77 at the start of conversion is shifted from bit 76 to bit 70 of shifters S in response to one-bit conversion signal C. Thereby bit a7 to bit a0 are sequentially set to "1."

Comparison between comparison voltage E output and decoded by D/A converter 3 and analog input voltage A is repeated for bits a7 to a0, and bits a7 to a0 are kept at "1" or cleared to "0". In this way, the value of each bit is determined, and a single A/D conversion result is obtained in sequential conversion register 2. Furthermore, when the data is shifted up to bit 7S, conversion complete signal F becomes active to complete conversion.

Such a sequential conversion-type A/D converter is used to convert input data such as the water temperature of an engine radiator (TR), an engine boost pressure (BP), or car acceleration (MP) into digital signals. Such input data is selectively input into comparator 1 by clock generator circuit 5 as analog signal A for conversion into a digital signal.

Since the conventional sequential conversion-type A/D converter is structured as described above, a predetermined conversion time is always required for the conversion of an analog input signal which shows small changes. Say, for example, that the water temperature of the radiator (TR) changes slightly a predetermined time period tl after the start of an engine, as shown in FIG. 13. Despite the small change over a predetermined range P from TR1 to TR2, all the bits of sequential conversion register 2, from the leading bit sequentially downward, are set to "1," during sequential conversion. Therefore, it takes time to obtain the result of conversion.

SUMMARY OF THE INVENTION

The present invention is intended to solve the above problem, and it is an object of the invention to achieve a sequential conversion-type A/D converter which can convert an analog input signal showing small changes in a shorter period of time than the conventional A/D converter, without compromising conversion accuracy.

The sequential conversion-type A/D converter according to the present invention comprises a fixing bit register for identifying which bits of sequential conversion register 2 are to be fixed, a fixed value register for holding the binary values of the bits of the sequential conversion register to be fixed, and a conversion start position setting circuit for identifying a leading bit of a lower order than the bits of the sequential conversion register to be fixed. Control circuit 4 starts sequential conversion from a leading bit set by the conversion start position setting circuit.

In the sequential conversion-type A/D converter according to the present invention, several bits of a conversion result are fixed in advance and the conversion of only unfixed bits is performed. Conversion can then be completed in a shorter period of time than with the conventional A/D converter.

The above and other objects, features and advantages of the invention will become more apparent from the following description when taken in conjunction with the accompanying drawings.

DESCRIPTION OF THE PREFERRED EMBODIMENT

Figure 1:
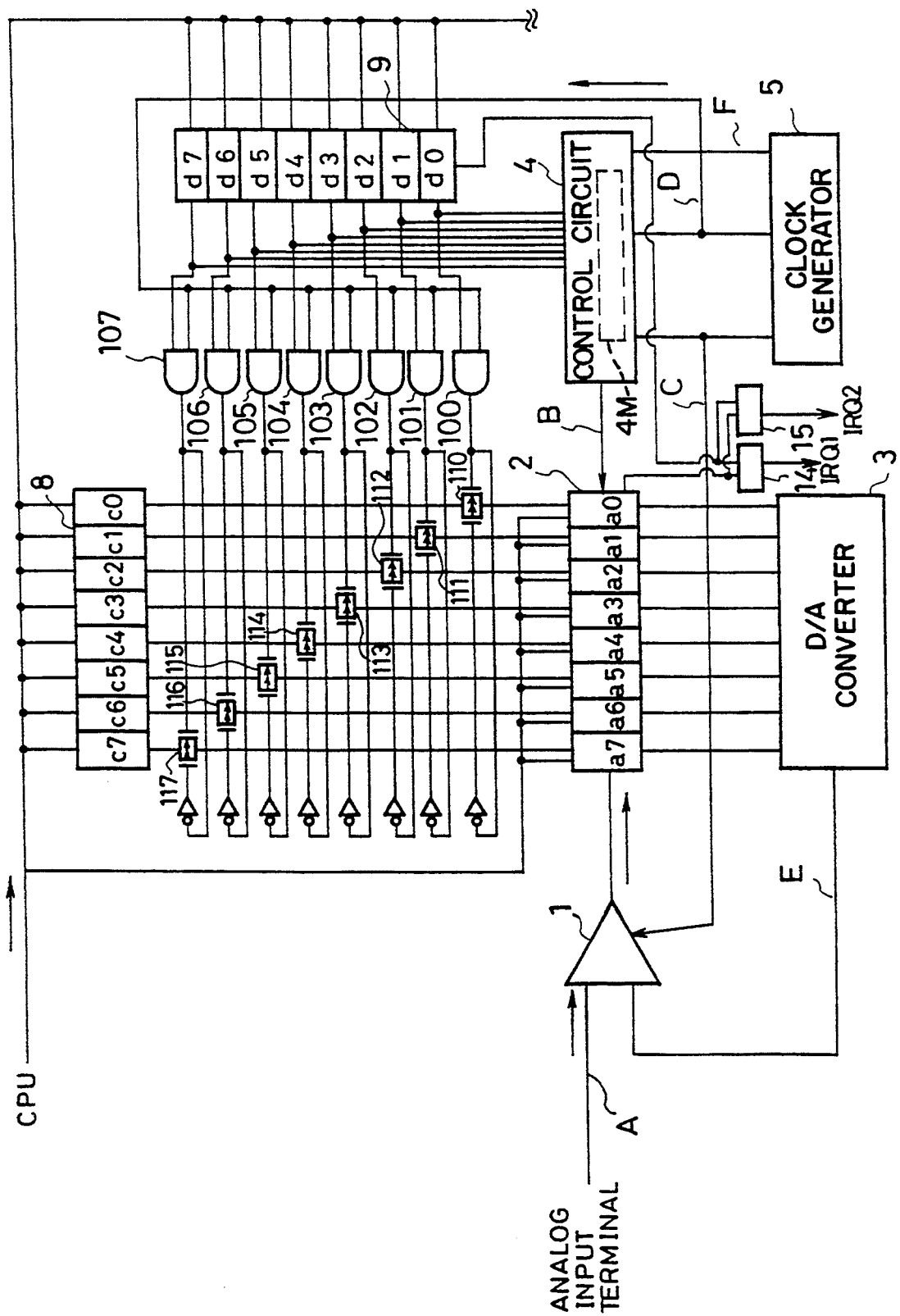
FIG. 1 is a diagram of the configuration of a sequential conversion-type A/D converter according to an embodiment of the invention.
Figure 2:
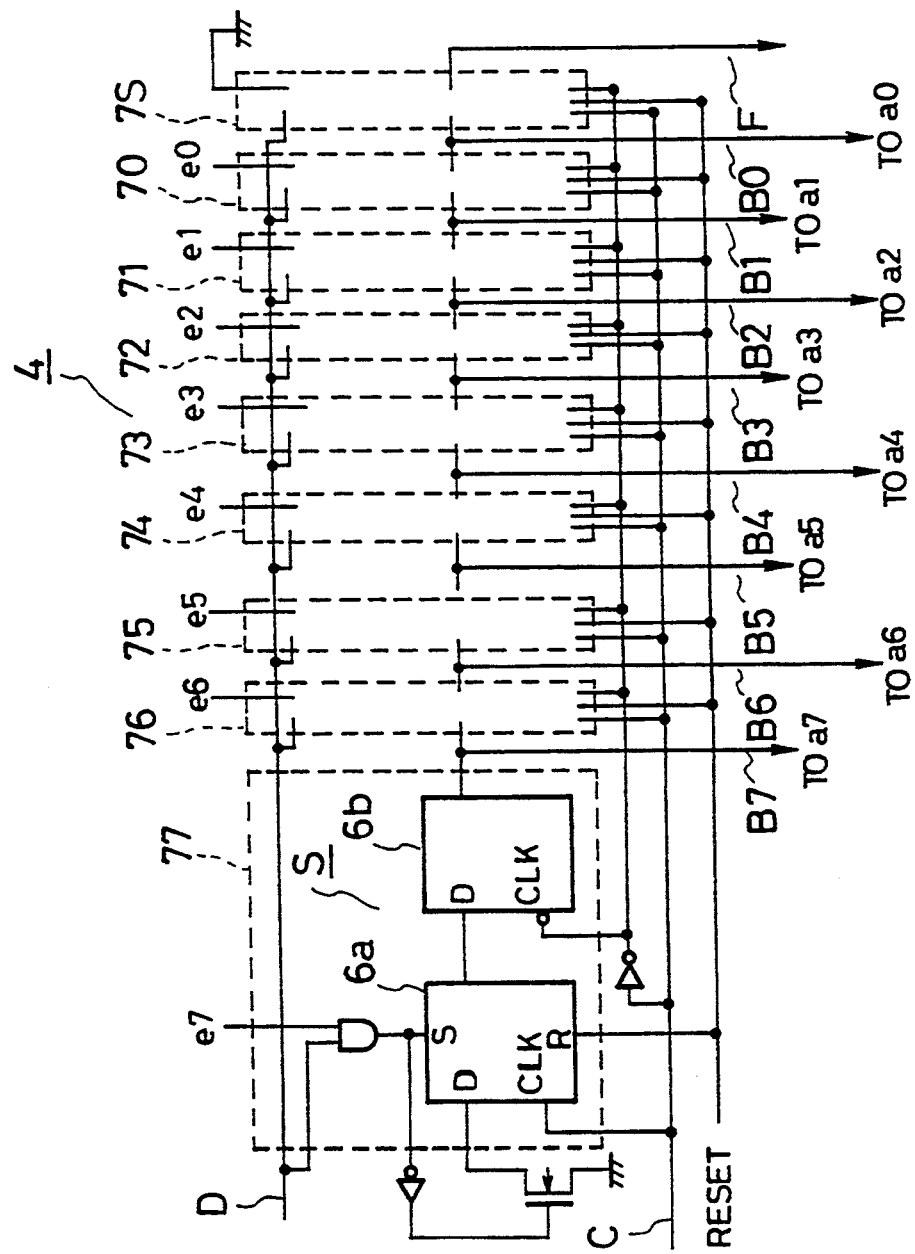
FIG. 2 is a diagram of a control circuit for sequential conversion according to the invention.
Figure 3:
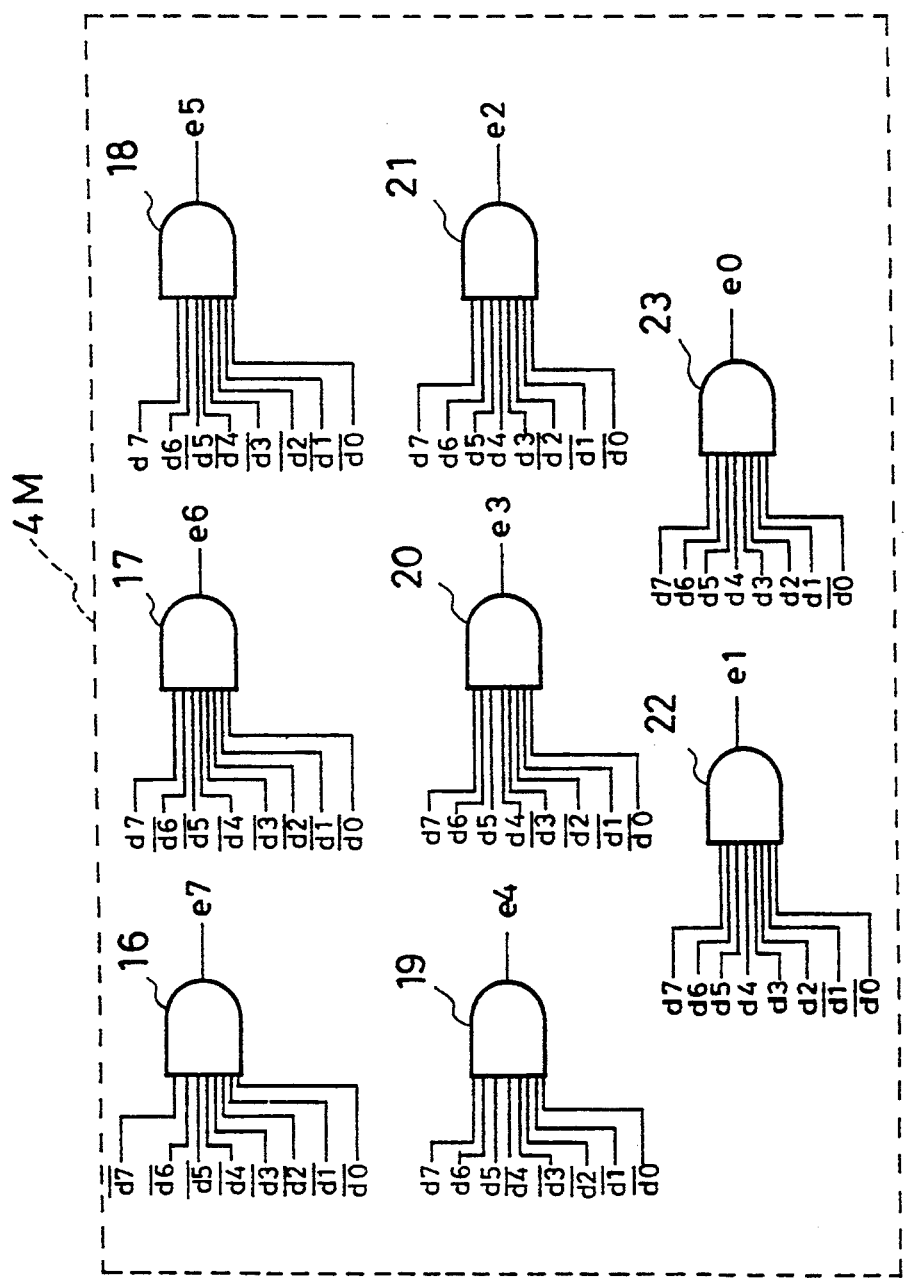
FIG. 3 is a schematic diagram of a conversion start position setting circuit according to the invention.
Figure 4:
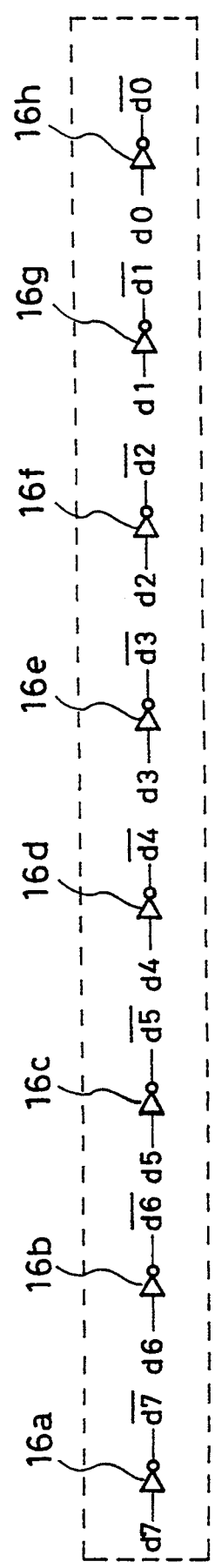
FIG. 4 is a schematic diagram of an inverter circuit according to the invention.

FIGS. 1 to 6 are diagrams of the configuration of a sequential conversion-type A/D converter according to a preferred embodiment of the present invention.

In these figures are shown comparator 1 for comparing an analog input signal A and comparison voltage E from D/A converter 3; sequential conversion register 2 for storing the result of A/D conversion; D/A converter 3; control circuit 204 for sequential conversion; clock generator circuit 5 for A/D conversion; fixed value register 8 for setting fixed data values; fixing bit register 9 for identifying bits to be fixed; AND circuits 100 to 107 for generating signals for controlling the load of the fixed data into sequential conversion register 2 according to the values of fixing bit register 9 and in response to a conversion start signal; transmission gates 110 to 117; AND circuits 12 and 13; and detection circuits 14 and 15 for detecting whether all unfixed bits are "1" and "0", respectively. Also shown are analog input signal A; control signals B, supplied to sequential conversion register 2 from control circuit 204; one-bit conversion signal C, supplied to the control circuit 204 and comparator 1 from clock generator circuit 5; and A/D conversion start signal D. FIGS. 1–6 show comparison voltage E output from D/A converter 3; and conversion complete signal F.

Furthermore, the figures show latch circuit 6a, which can be set (S) and reset (R), for taking in data during a time interval "H" of an input clock signal and for latching data on the falling edge of the input clock signal; latch circuit 6b, for taking in data during a time interval "L" of the input clock signal and for latching data on the rising edge of the input clock signal; bits 77 to 70 and 7S of shifter S forming control circuit 204; and control signals B7 to B0 supplied to bits a7 to a0 of sequential conversion register 2 and corresponding to bit setting signals B of FIG. 1. AND circuits 16 to 23 decode the control signals for setting each bit of sequential conversion register 2 to "1" at the start of conversion.

When conversion start position setting signals e7 to e0 are "1", bits 77 to 70 are forcedly set at "1." For example, when only conversion start position setting signal e4 is "1" only bit 74 is set at "1". Then sequential conversion proceeds from bit 74 to bit 70, one after another, by the normal operation of control circuit 204. In other words, sequential conversion starts with bit 74. Here, conversion start position setting signals e7 to e0 are output from AND circuits 16 to 23 which form conversion start position setting circuit 4M of FIG. 3. Inputs of predetermined combinations of bit signals d7 to d0 and their inverted signals of fixing bit register 9 are supplied to these AND circuits. For example, bits d7, d6 and d5, and the inverted signals of bits d4, d3, d2, d1 and d0 are input to AND circuit 19. The inverted signals of bits d7 to d0 are generated from inverter circuits 16a to 16h shown in FIG. 4. Therefore, when bits d7 to d5 of fixing bit register 9 are set to "1," for example, only AND circuit 19 becomes active and only conversion start position setting signal e4 becomes "1," so that sequential conversion starts from bit 74 of the shifter S.

Figure 5:
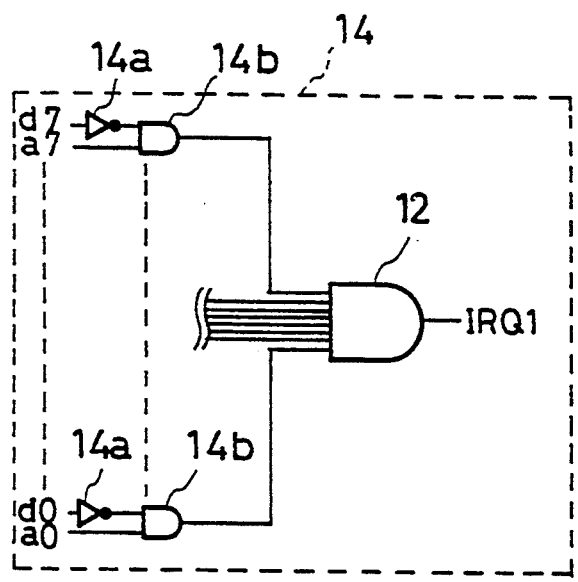
FIG. 5 is a diagram of an all-bits-"1" detection circuit according to the invention.
Figure 6:
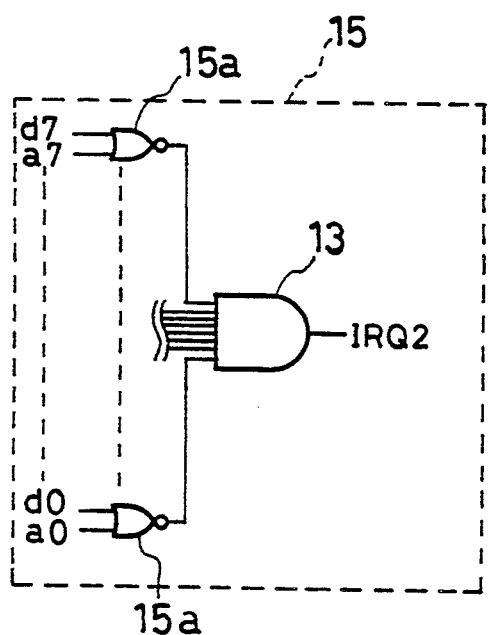
FIG. 6 is a diagram of an all-bits-"0" detection circuit according to the invention.

As shown in FIG. 5, the A/D converter of the present invention comprises all-bits-"1" detection circuit 14 which consists of AND circuits 14b for obtaining the logical products of the inverted signal of bit d7 of fixing bit register 9 and bit a7, the inverted signal of bit d6 and bit a6, the inverted signal of bit d5 and bit a5, the inverted signal of bit d4 and bit a4, the inverted signal of bit d3 and bit a3, the inverted signal of bit d2 and bit a2, the inverted signal of bit d1 and bit a1, and the inverted signal of bit d0 and bit a0; and AND circuit 12 for obtaining the logical product of the outputs of these AND circuits 14b. All-bits-"1" detection circuit 14 detects that all unfixed bits of sequential conversion register 2 are "1" and outputs all-bits-"1" detection signal IRQ1. As shown in FIG. 6, the A/D converter further comprises the all-bits-"0" detection circuit 15 which consists of NOR circuits 15a for obtaining the logical sums of bit d7 of the fixing bit register 9 and bit a7, bit d6 and bit a6, bit d5 and bit a5, bit d4 and bit a4, bit d3 and bit a3, bit d2 and bit a2, bit d1 and bit a1, and bit d0 and bit a0; and AND circuit 13 for obtaining the logical sum of the outputs of these NOR circuits 15a. All-bits-"0" detection circuit 15 detects that all unfixed bits of sequential conversion register 2 are "0" and outputs all bits-"0" detection signal IRQ2.

Next, the operation of the A/D converter will be described. Since the A/D conversion of this embodiment of the present invention is of the sequential conversion type, its basic operation is the same as that of the prior art. The invention differs from the prior art in that, at the start of conversion, specified bits of sequential conversion register 2 are fixed at a specified value. The bit following the fixed bits is set to "1" to start conversion. That is, fixing bit data identifying which bits in the sequential conversion register are to be fixed and fixed value data for setting bits to be fixed to "1", for example, are set in fixing bit register 9 and fixed data register 8, respectively, to start A/D conversion. When the A/D conversion start signal becomes active, only AND circuits connected to bits to be fixed become active as identified by fixing bit register 9, and only the bit data of fixed value register 8 corresponding to the bits to be fixed are loaded into sequential conversion register 2. At the same time, in control circuit 204, one of the decoder AND circuits 16 to 23 for setting a bit following the fixed bits becomes active, and, accordingly, one of conversion start position setting signals e7 to e0 becomes active. Only the bit of shifter S connected to the active conversion start position setting signal is set to "1". At this time A/D conversion is performed, starting from the bit of sequential conversion register 2 corresponding to the bit of shifter S which has been set to "1" and proceeding through lower order bits by iterative conversion of one bit at a time, like the conventional A/D converter. In other words, the A/D converter of the present invention converts only bits of an order lower than the fixed bits.

For example, to fix high-order bits a7, a6 and a5 of sequential conversion register 2 at "1", "0" and "0", respectively, only bits d7, d6 and d5 of fixing bit register 9 are set at "1". That is, bits d7 to d0 are set at "1", "1", "1", "0", "0", "0", "0" and "0" and bits c7 to c5 of fixed value register 8 are set at "1", "0" and "0", respectively. In other words, when bits c7 to c0 are set at "1", "0", "0", "0", "0", "0", "0" and "0" and conversion is started by conversion start signal D, only AND circuits 107, 106 and 105 become active, and transmission gates 117, 116 and 115 connected to these AND circuits are ON so that the "1", "0" and "0" of bits c7, c6 and c5 of fixed value register 8 are loaded to bits a7, a6 and a5, respectively. Thereafter, only conversion start position setting signal e4 of AND circuit 19 of conversion start position setting circuit 4M is active, and bit 74 of shifter S is set at "1" by this conversion start position setting signal e4. Consequently, the sequential conversion of only bits a4 to a0 is performed by the unique operation of the control circuit 204 for sequential conversion. Bit a4 is first set to "1" to start conversion, and conversion up to bit a0 is performed to achieve a single conversion value.

Figure 13:
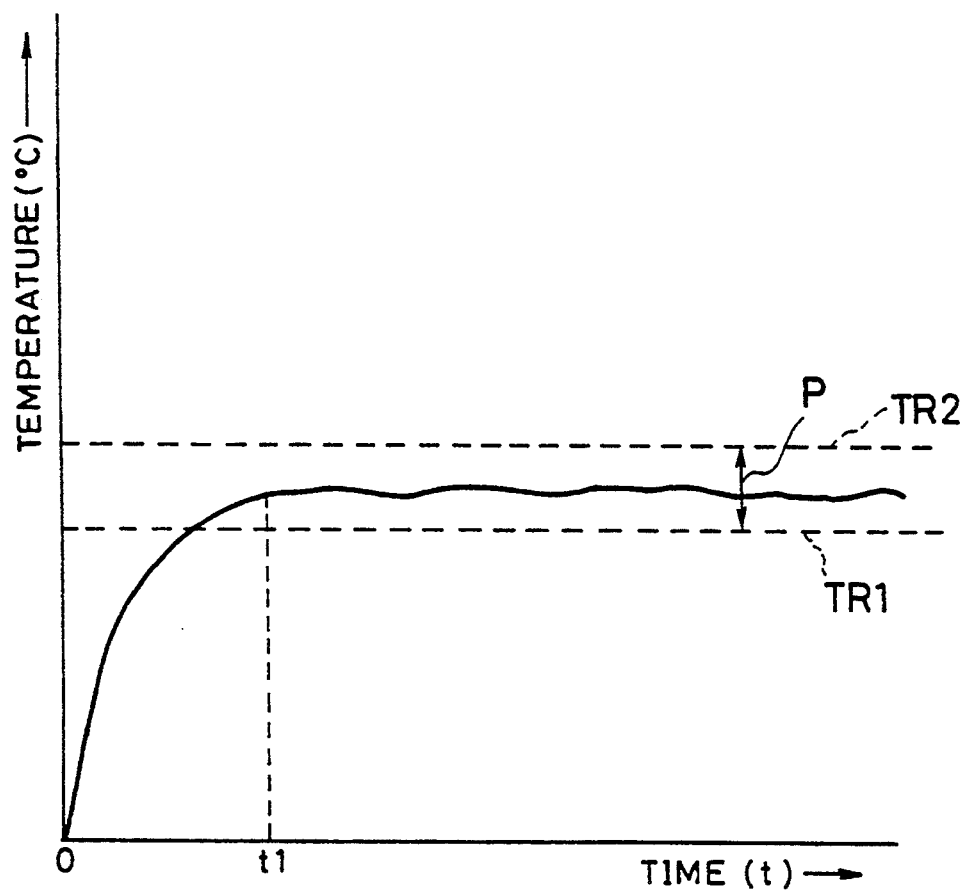
FIG. 13 is a diagram of an analog input signal input into the conventional sequential conversion-type A/D converter.

According to the present invention, conversion time for an analog input signal which shows small changes as shown in FIG. 13 can be reduced, and the same accuracy of a conversion result from the prior art can be achieved.

Furthermore, according to the present invention, with circuits 14 and 15 for detecting that all unfixed bits are "1" and "0", respectively, it is possible to detect when an analog input voltage is outside the range of A/D conversion defined by the non-fixed bits. The detection signals from these circuits can be used as interrupt signals IRQ1 and IRQ2 to handle this case by interrupt processing. In other words, since interrupt signals IRQ1 and IRQ2 are output from all-bits-"1" detection circuit 14 and all-bits-"0" detection circuit 15 when the analog input signal falls below the lower limit or goes beyond the upper limit of a predetermined range P, the process goes to an interrupt routine where an alarm lamp (not shown) is generated or an interrupt is generated to suspend the operation of the A/D converter in order to take a countermeasure. Alternatively, when an IRQ (interrupt signal) is generated by detecting that all unfixed bits are "0" or "1", the process enters an interrupt processing routine where the data of fixing bit register 9 and fixed value register 8 are reset and the variable range of an analog input is changed to continue conversion.

Figure 7:
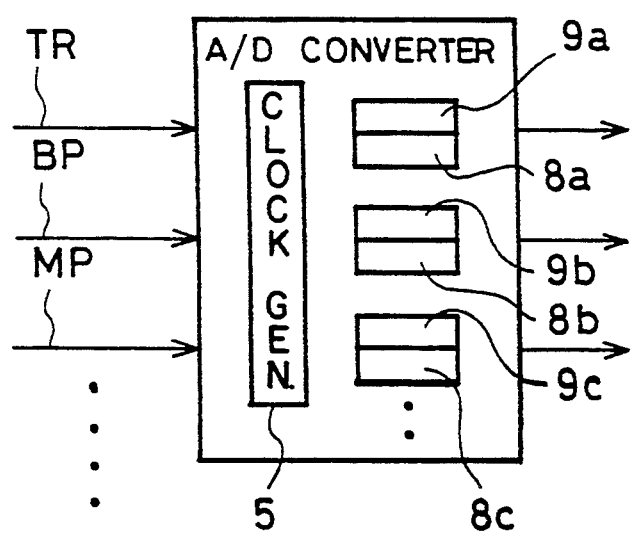
FIG. 7 is a diagram of a sequential conversion-type A/D converter according to another embodiment of the invention.

Furthermore, as shown in FIG. 7, when a plurality of analog input signals such as TR, BP and MR are input and one of them is selected for A/D conversion, the A/D converter comprises three pairs of fixing bit registers 9a to 9c and fixed value registers 8a to 8c for these three analog input signals. The appropriate pair of registers is selected according to the selected analog input signal.

Figure 8:
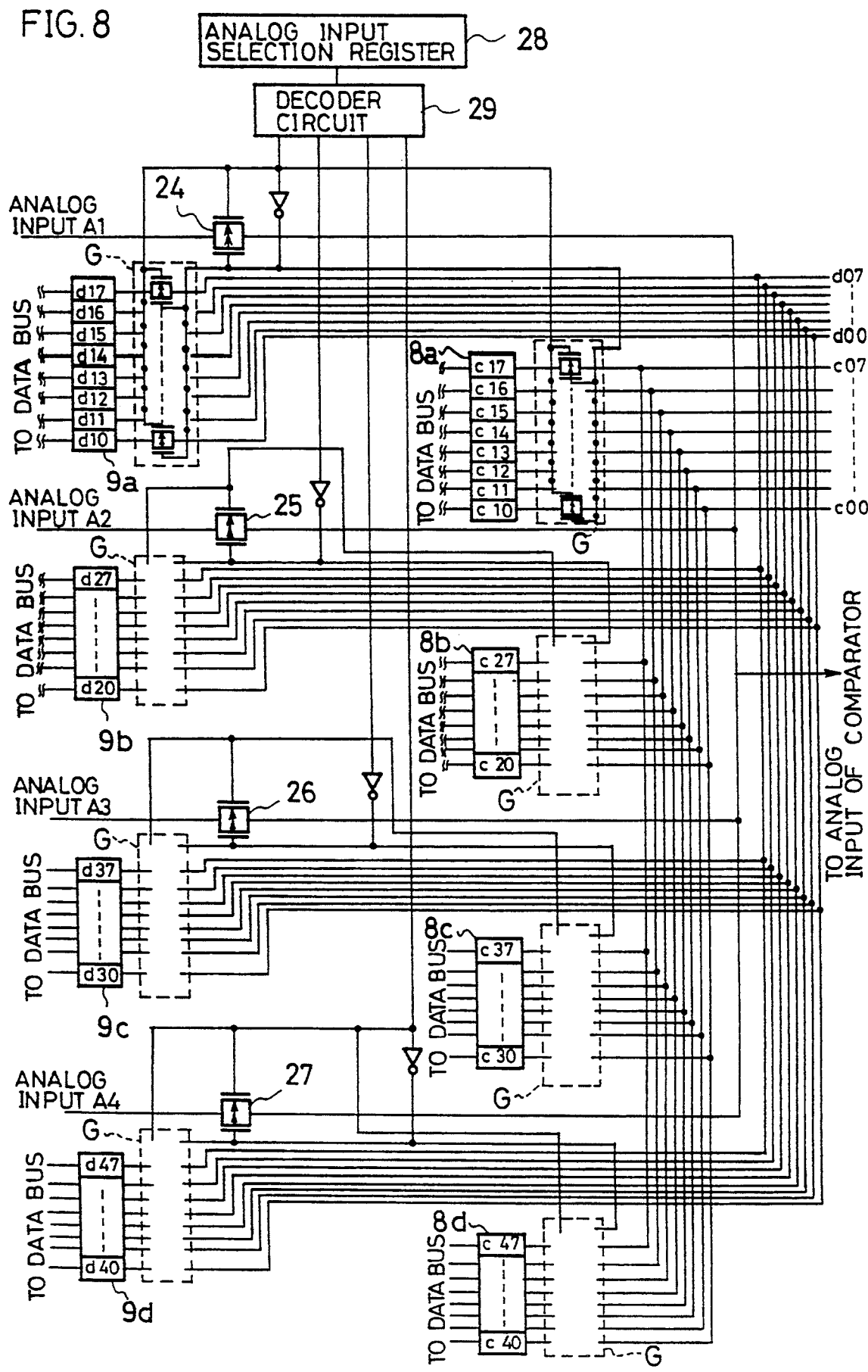
FIG. 8 is a diagram of the configuration of a sequential conversion-type A/D converter which consists of a four-input eight-bit A/D converter according to another embodiment of the invention.

A four-input eight-bit A/D converter will be described with reference to FIG. 8 as an example for implementing this.

Figure 9:
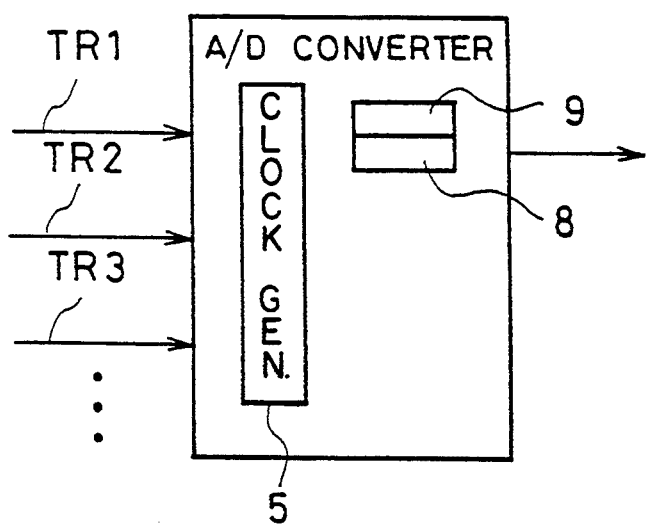
FIG. 9 is a diagram of a sequential conversion-type A/D converter according to another embodiment of the invention.
Figure 10:
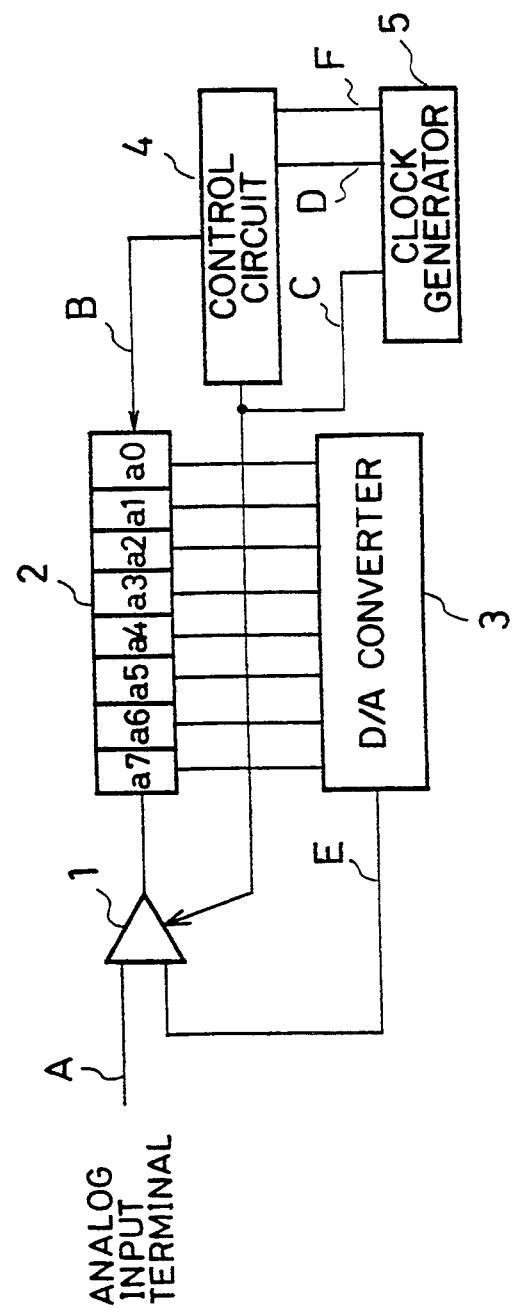
FIG. 10 is a diagram of a conventional sequential conversion-type A/D converter.
Figure 11:
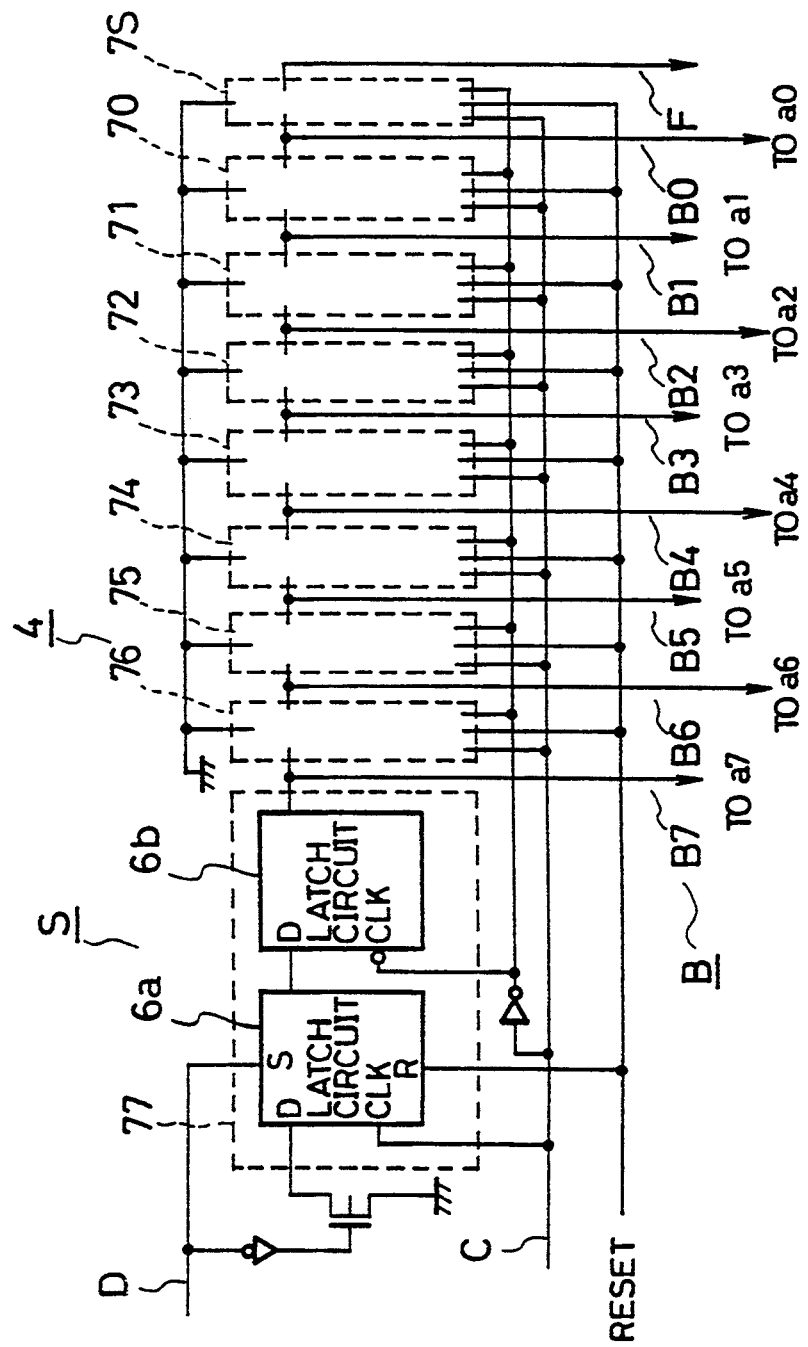
FIG. 11 is a diagram of the detailed configuration of the conventional sequential conversion-type A/D converter.
Figure 12:
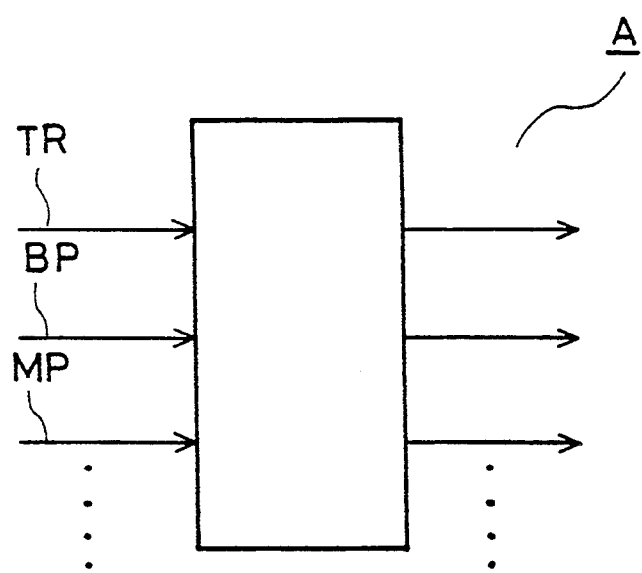
FIG. 12 is a diagram of an analog input to be converted by the conventional A/D converter.

This embodiment comprises first fixed value register 8a and first fixing bit register 9a for analog input signal A1 (TR), second fixed value register 8b and second fixing bit register 9b for analog input signal A2 (BP), third fixed value register 8c and third fixing bit register 9c for analog input signal A3 (MR), and fourth fixed value register 8d and fourth fixing bit register 9d for analog input signal A4. One pair consisting of a fixing bit register and a fixed value register for an analog input signal to be converted is selected, and conversion is performed on the data of the selected registers. In other words, in FIG. 8, four analog input signals A1 to A4 are connected to the respective analog inputs of the comparator through respective transmission gates 24 to 27. One of the analog inputs is selected by a control signal, obtained by decoding the data of analog input selection register 28 with decoder circuit 29, and supplied to the analog input of the comparator. At the same time, a pair consisting of a fixing bit register and a fixed value register for the analog input selected by this selection signal is selected. Then, signals (d07 to d00, c07 to c00) for supplying the data of the selected fixing bit register and the data of the selected fixed value register to each control circuit are supplied to each control circuit through each gate circuit G in place of the data (d7 to d0) of fixing bit register 9 and the data (c7 to c0) of fixed value register 8 of the above-mentioned embodiment (FIG. 1). This makes possible A/D conversion using fixing bits and fixed values for a selected analog input signal. In this way, conversion with the optimum setting for each analog input signal can be performed, and the total time required for conversion can be reduced. As shown in FIG. 9, a pair consisting of fixing bit register 9 and fixed value register 8 may be shared by a plurality of analog input signals TR1, TR2 and TR3, all of which have the same fluctuation width.

According to the present invention, since the A/D converter comprises a fixing bit register for identifying bits in the sequential conversion register to be fixed, a fixed value register for setting bits to be fixed at "1" or "0", a conversion start position setting circuit for converting bits of a lower order than the bits of the sequential conversion register identified by the fixing bit register, and a control circuit for starting sequential conversion from a bit set by the conversion start position setting circuit, it is possible to reduce conversion time for analog input signals which show small changes and to achieve the same accuracy of a conversion result as the prior art. Moreover, when the A/D converter further comprises an all-bits-"0" detection circuit for detecting that the converted values of unfixed bits of the sequential conversion register are all "0" and an all-bits-"1" detection circuit for detecting that the converted values of unfixed bits of the sequential conversion register are all "1", it is easily possible to detect when an analog input signal is outside the range of A/D conversion defined by non-fixed bits and to handle this case by interrupt processing using these detection signals from the detection circuits as an interrupt signal.

What is claimed is:

1. A sequential conversion-type A/D converter having a control circuit for sequentially converting a set of bits, each having a logical value, representing a digital value held in a sequential conversion register, with said conversion proceeding from a leading high-order bit in the set of bits to low-order bits in the set of bits with each bit sequentially set to a converted value according to the result of comparison between an analog value converted from the digital value of said sequential conversion register and an analog input signal with a comparator, characterized in that the converter comprises:

a fixing bit identifying register, holding a set of fixing bits corresponding to the set of bits held in the sequential conversion register, with a group of high-order fixing bits having a first logical value identifying a corresponding group of high-order bits in said sequential conversion register which will have fixed logical values during sequential conversion, a fixed value register, holding a set of fixed value bits corresponding to the set of bits held in the sequential conversion register, with a group of high-order fixed value bits for setting the fixed logical values of the group of high-order bits in said sequential conversion register, a bit fixing circuit, coupled to said fixing bit identifying register, said fixed value register, and the sequential conversion register, for setting the logical values of the group of high-order bits in said sequential conversion register, identified by the group of high-order fixing bits, equal to the logical values of the group of high-order fixed value bits;

a conversion start position setting circuit, coupled to said fixing bit identifying register and said sequential conversion register, for initiating sequential conversion beginning at a first bit of a lower order of bits not included in a group of high-order fixed bits of said sequential conversion register.

2. A sequential conversion type A/D converter according to claim 1, wherein the A/D converter further comprises an all bit "0" detection circuit, coupled to said sequential conversion register and said fixing bit identifying register, for detecting that the converted values of unfixed bits in said lower-order group of bits of said sequential conversion register are all logical "0".

3. A sequential type A/D converter according to claim 2, wherein said all bit "0" detection circuit consists of NOR circuits for performing NOR operations on corresponding bits from said fixing bit identifying register and from said sequential conversion register to form a plurality of logical sums, and an AND circuit, coupled to said NOR circuits, for performing an AND operation on the logical sums formed by said NOR circuits.

4. A sequential conversion type A/D converter according to claim 1, wherein the A/D converter further comprises an all bit "1" detection circuit, coupled to said sequential conversion register and said fixing bit identifying register, for detecting that the converted values of unfixed bits in said lower-order group of bits of said sequential conversion register are all logical "1".

5. A sequential type A/D converter according to claim 4, wherein said all bit "1" detection circuit consists of a plurality of first AND circuits for performing AND operations on corresponding bits from said fixing bit identifying register and from said sequential conversion register to form a plurality of logical sums, and a second AND circuit, coupled to said plurality of first AND circuits, for performing an AND operation on the logical sums formed by said first AND circuits.

6. A sequential conversion type A/D converter according to claim 4, wherein an alarm is generated by the output of said all bit "1" detection circuit.

7. A sequential conversion type A/D converter according to claim 2, wherein an alarm is generated by the output of said bit "0" detection circuit.

8. A sequential conversion-type A/D converter having a control circuit for sequentially converting a set of bits, each having a logical value, representing a digital value held in a sequential conversion register, with said conversion proceeding from a leading high-order bit in the set of bits to low-order bits in the set of bits with each bit sequentially set to a converted value according to the result of comparison between an analog value converted from the digital value of said sequential conversion register and a selected analog input signal with a comparator, characterized in that the converter comprises:

a selection control circuit for generating control signals responsive to a selection input, an analog input selection circuit, responsive to said control signals, for selecting one out of a plurality of analog input signals as the selected analog input signal, a plurality of fixing bit identifying registers, each holding a set of fixing bits corresponding to the set of bits held in the sequential conversion register, with a group of high-order fixing bits having a first logical value identifying a corresponding group of high-order bits in said sequential conversion register which will have a fixed logical value during sequential conversion, a plurality of fixed value registers, each holding a set of fixed value bits corresponding to the set of bits held in the sequential conversion register with a group of high-order fixed value bits for setting the fixed logical values of the group of high-order bits in said sequential conversion register, and a register selection circuit, for selecting one of said plurality of fixing bit identifying registers as a selected fixing bit identifying registers and one of said plurality of fixed value registers as a selected fixed value register, a bit fixing circuit, coupled to said selected fixing bit identifying register and said selected fixed value register by said register selection circuit and coupled to said sequential conversion register, for setting the logical values of the group of high-order bits in said sequential conversion register identified by the group of high-order fixing bits equal to the logical values of the group of high-order fixed value bits;

a conversion start position setting circuit, coupled to said sequential conversion register and said selected fixed bit identifying register by said register selection circuit, for initiating sequential conversion beginning at a first bit of lower order than the group of high-order fixed bits of said sequential conversion register.

* * * * *